(12) United States Patent
Deng

(10) Patent No.: US 6,194,917 B1
(45) Date of Patent: Feb. 27, 2001

(54) XOR DIFFERENTIAL PHASE DETECTOR WITH TRANSCONDUCTANCE CIRCUIT AS OUTPUT CHARGE PUMP

(75) Inventor: Dan Zhichao Deng, Santa Clara, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/234,608

(22) Filed: Jan. 21, 1999

(51) Int. Cl.[7] .............................. H03K 5/26; H03K 19/21; H03L 7/06
(52) U.S. Cl. .......................... 327/12; 327/147; 327/156; 326/55; 326/115; 331/25
(58) Field of Search ................................... 327/3, 12, 156, 327/157, 536, 537, 5, 146, 147, 148, 155; 326/52, 55, 54, 115, 119, 121, 112; 331/25, 1 A; 330/253

(56) References Cited

U.S. PATENT DOCUMENTS

| 4,006,365 | * | 2/1977 | Marzin et al. | 326/55 |
|---|---|---|---|---|
| 5,252,865 | * | 10/1993 | Davenport et al. | 327/336 |
| 5,514,948 | * | 5/1996 | Okazaki | 327/539 |
| 5,523,707 | * | 6/1996 | Levy et al. | 326/52 |
| 5,568,073 | * | 10/1996 | McClure | 327/52 |
| 5,614,841 | * | 3/1997 | Marbot et al. | 326/52 |
| 5,714,912 | * | 2/1998 | Fiedler et al. | 327/280 |
| 5,861,762 | * | 1/1999 | Sutherland | 365/55 |
| 5,942,940 | * | 8/1999 | Dreps et al. | 330/253 |
| 5,953,386 | * | 9/1999 | Anderson | 327/156 |

OTHER PUBLICATIONS

Wang, et al. "A Voltage–Controllablee Linear MOS Transconductor Using Bias Offset Technique", IEEE Journal of Solid–State Circuits, Feb. 1990, vol. 25, No. 1. pp. 315–317.

* cited by examiner

Primary Examiner—Timothy P. Callahan
Assistant Examiner—Terry L. Englund
(74) Attorney, Agent, or Firm—Limbach & Limbach, LLP

(57) ABSTRACT

An apparatus for and method of reducing transistor body effect when detecting and correcting a phase error between clock signals using delay-locked and phase-locked loop circuits. The clock signals are provided to an equal number of circuit elements in cross-coupled XOR circuits. The circuit includes a transconductance circuit having at least two PMOS transistors with their substrates directly connected to their sources.

14 Claims, 7 Drawing Sheets

XOR DIFFERENTIAL PHASE DETECTOR WITH TRANSCONDUCTANCE CIRCUIT AS OUTPUT CHARGE PUMP

BACKGROUND OF THE INVENTION

1. Field of the Invention

The present invention relates to delay-locked loop circuits. In particular, the invention relates to reducing the body effect of circuit elements in delay-locked loop circuits.

2. Description of the Related Art

In the design of delay-locked or phase-locked loops, the phase detector is an important component. The basic idea of the loop is to measure the phase difference between two clock signals, or more specifically, to measure the timing difference between two rising edges of two clock signals, and then to feed back this timing difference information to a component such as a voltage controlled delay chain. The delay chain adjusts the timing delay of one (or both) of the clock signals, thereby bringing the timing difference to zero. A timing difference of zero is also called a phase alignment of zero, which means that the clock signals transition at the same time. In such a case the output of the phase detector should indicate that no phase adjustment is necessary.

However, there are two situations in which poor phase detector design can lead to phase alignment errors. First, a poor design may cause the phase detector to feed back adjustment information even when the two clock edges are already in alignment. Second, a poor design may cause the phase detector to misdetect zero phase alignment and not feed back adjustment information, even when the two clock signals are not in alignment. These errors are called static phase alignment errors.

One way in which the design of the phase detector contributes to static phase alignment error is when the clock signals must drive different numbers of transistors, some of which have body effect and some of which do not. For example, FIG. 1 shows an XOR phase detector circuit. Node 17 supplies power and node 19 is connected to ground. Node 18 connects the substrates of the transistors to ground. Clock signal 11 drives only one gate of transistor 13 but clock signal 12 drives two gates of transistors 14 and 15. So even if the designer sizes the transistors 13–15 to get equal loading for clock signals 11–12, clock signal 11 drives transistor 13 without body effect but clock signal 12 drives transistors 14–15 which do have body effect.

This body effect results from a voltage difference between the substrate and the source of each transistor. Transistor 13 has no body effect because its substrate is connected to node 18 and its source is connected to node 19, both of which are ground nodes. On the other hand, transistor 14 has body effect because, although its substrate is connected to node 18, its source is connected to the drain of transistor 13. Similarly, transistor 15 has body effect because its source is connected to the drain of transistor 16. Thus, it is easier for clock signal 11 to turn on its gate than for clock signal 12 to turn on its gates. The phase detector will then sense clock signal 11 differently than clock signal 12. This difference will contribute to the system static phase alignment error.

Another contribution to the error is the design of the charge pump. The output of the charge pump drives an adjustment circuit such as a voltage controlled oscillator (VCO). For generation of a good, low jitter VCO output, a small charge pump output ripple is needed. However, for many existing charge pumps, the output node is connected to rapidly switching PMOS and NMOS transistors, which will generate noise at the output node and lead to a large ripple.

A third contribution to the error is the design of the transconductance stage. FIG. 2 illustrates a typical transconductance circuit. The difference between currents $I_1$ and $I_2$ is proportional to the difference between the gate-to-source voltages of M1 and M2. However, this assumes that the gate-source voltages of M5 and M7 are both $V_B$. This is not correct if transistor body effect is considered, even when M5 and M7 are the same size and source the same current. This is because the threshold voltage of M5 is larger than that of M7 because the source-substrate voltage of M5 is not zero. This means the gate-source voltages of M5 and M7 cannot both be equal to $V_B$. The same is true for M6 and M8.

Body effect occurs when the potential of the substrate of a MOSFET is different from the source potential. The body effect increases the threshold voltage of the MOSFET. The body effect contributes to nonlinearity. A way is needed to overcome the body effect in both the phase detector and the transconductance circuit in a delay-locked loop circuit.

SUMMARY OF THE INVENTION

The present invention addresses these and other problems of the prior art by providing an apparatus for and method of reducing transistor body effect when detecting and correcting a phase error.

According to one embodiment, an apparatus according to the present invention includes a circuit for reducing transistor body effect when generating phase signals resulting from input signals, and includes a phase detector circuit having a plurality of circuit elements. The phase detector circuit is configured to receive a first signal, a first complementary signal being complementary to the first signal, a second signal, and a second complementary signal being complementary to the second signal. The phase detector circuit is configured to generate a first XOR signal being an XOR of the first signal and the second signal, and to generate a second XOR signal being a complementary XOR of the first signal and the second signal. The first signal, the first complementary signal, the second signal, and the second complementary signal are each received by an equal portion of the circuit elements, reducing transistor body effect.

According to another embodiment, an apparatus according to the present invention includes a circuit for reducing transistor body effect when generating an output signal proportional to a difference between two input signals, and includes a transconductance circuit. The transconductance circuit is configured to receive a first signal and a second signal. The transconductance circuit is configured to generate a transconductance signal proportional to a difference between the first signal and the second signal. The transconductance circuit has two PMOS transistors each including a substrate and a source. The substrate and source of each are coupled together, reducing transistor body effect.

According to yet another embodiment, a method according to the present invention reduces transistor body effect when generating an output signal proportional to a difference between two input signals, and includes the steps of receiving a first signal, a first complementary signal being complementary to said first signal, a second signal, and a second complementary signal being complementary to said second signal, and providing each signal to an equal portion of a plurality of circuit elements. The method further includes the steps of generating a first phase signal based on a first XOR signal being an XOR of the first signal and the second signal, and generating a second phase signal based on a second XOR signal being a complementary XOR of the first signal and the second signal. The method further includes the step of coupling a source to a substrate of two PMOS transistors. The method finally includes the step of generating a transconductance signal proportional to a difference between the first phase signal and the second phase signal. Transistor body effect is reduced by generating the transconductance signal using the coupled transistors.

DETAILED DESCRIPTION OF THE PREFERRED EMBODIMENTS

Figure 3:
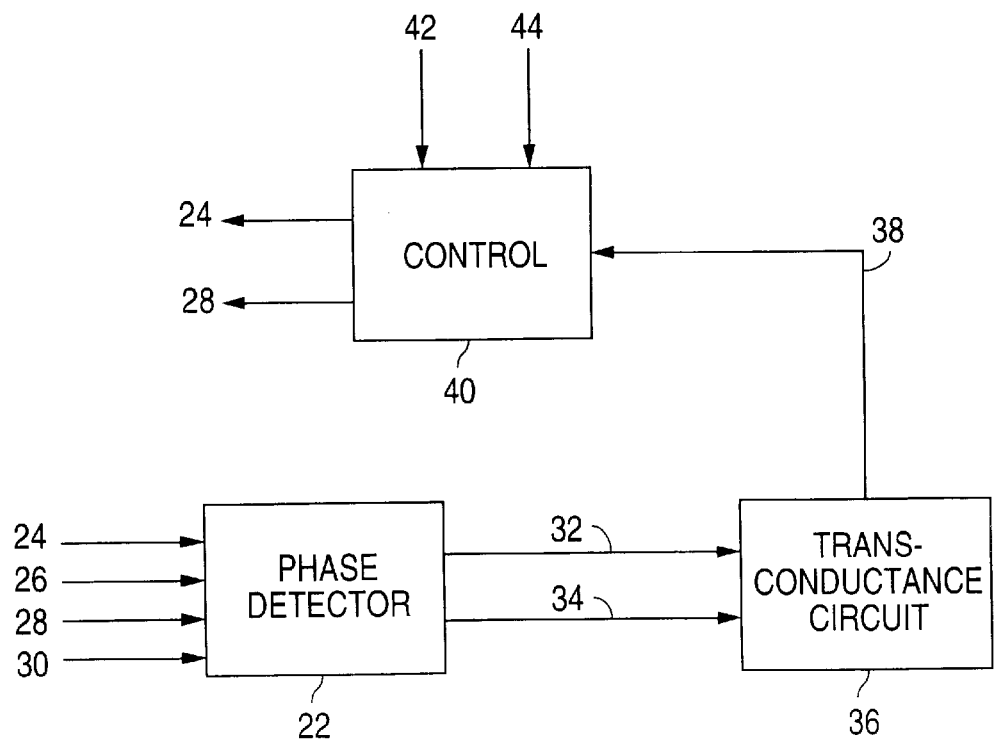
FIG. 3 is a block diagram of a delay-locked loop circuit according to the present invention.

FIG. 3 shows a block diagram of a delay-locked loop circuit according to the present invention, the details of which are provided in subsequent figures. A phase detector circuit 22 receives a first clock signal 24, a first complementary clock signal 26, a second clock signal 28, and a second complementary clock signal 30. First complementary clock signal 26 is complementary to first clock signal 24, and second complementary clock signal 30 is complementary to second clock signal 28.

Phase detector circuit 22 generates a first phase signal 32 and a second phase signal 34. First phase signal 32 is based on a first XOR signal being an XOR of first clock signal 24 and second clock signal 28. Second phase signal 34 is based on a second XOR signal being a complementary XOR of first clock signal 24 and second clock signal 28. The phase signals 32 and 34 are related to a phase difference between the clock signals 24 and 28.

A transconductance circuit 36 receives first phase signal 32 and second phase signal 34 and generates a transconductance signal 38. Transconductance signal 38 is proportional to a difference between first phase signal 32 and second phase signal 34.

A control circuit 40 receives transconductance signal 38, a first unadjusted clock signal 42, and a second unadjusted clock signal 44. Control circuit 40 adjusts a relative phase between first unadjusted clock signal 42 and second unadjusted clock signal 44, and generates first clock signal 24 and second clock signal 28. In this manner, a phase difference between the unadjusted clock signals may be detected and corrected.

Figure 4:
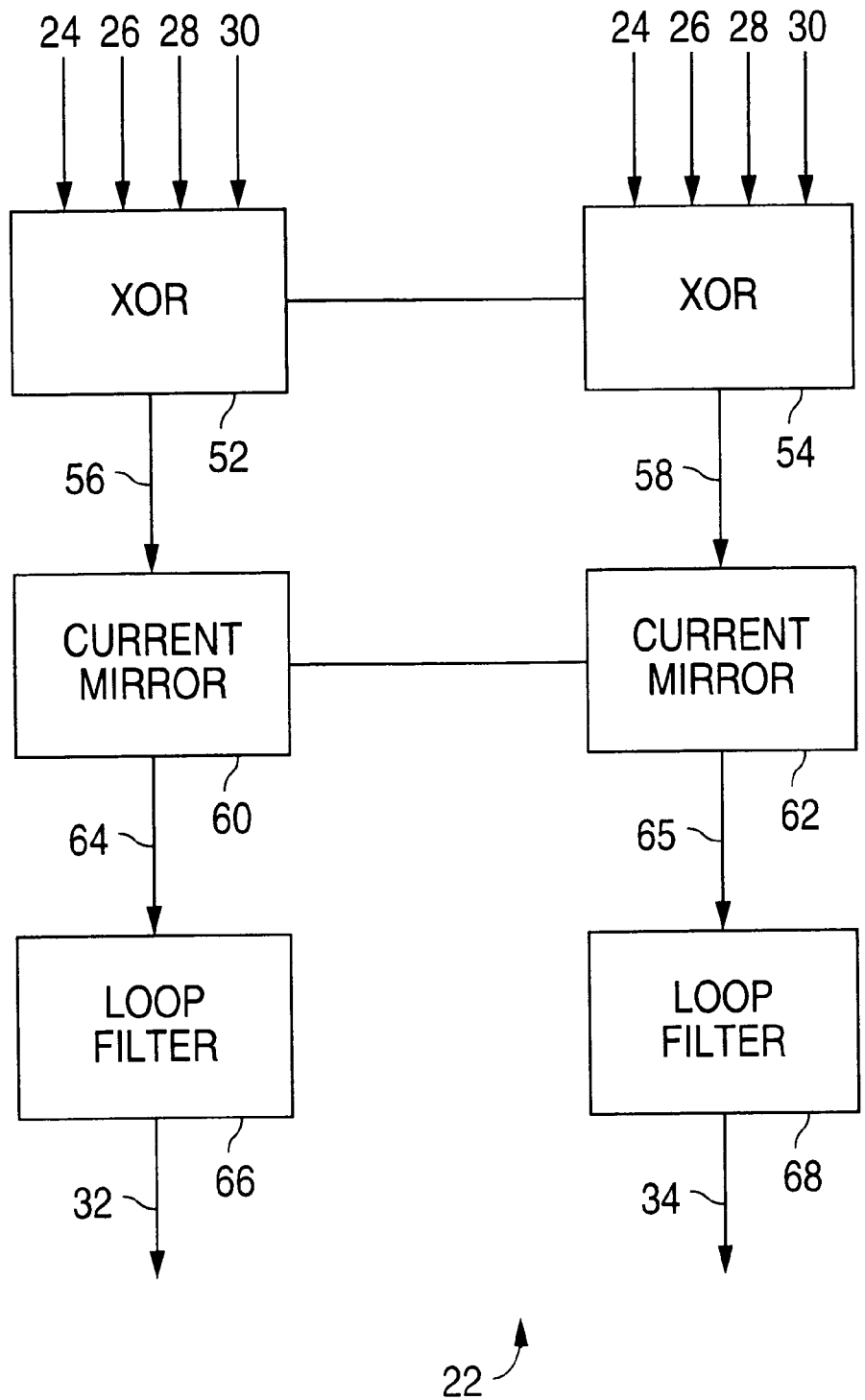
FIG. 4 is a block diagram of a phase detector circuit according to the present invention.

FIG. 4 shows more detail of phase detector circuit 22. First XOR circuit 52 and second XOR circuit 54 receive first clock signal 24, first complementary clock signal 26, second clock signal 28, and second complementary clock signal 30. First XOR circuit 52 and second XOR circuit 54 are cross-coupled to generate a first XOR signal 56 and a second XOR signal 58. This cross-coupling is more specifically shown in FIG. 5.

Figure 7:
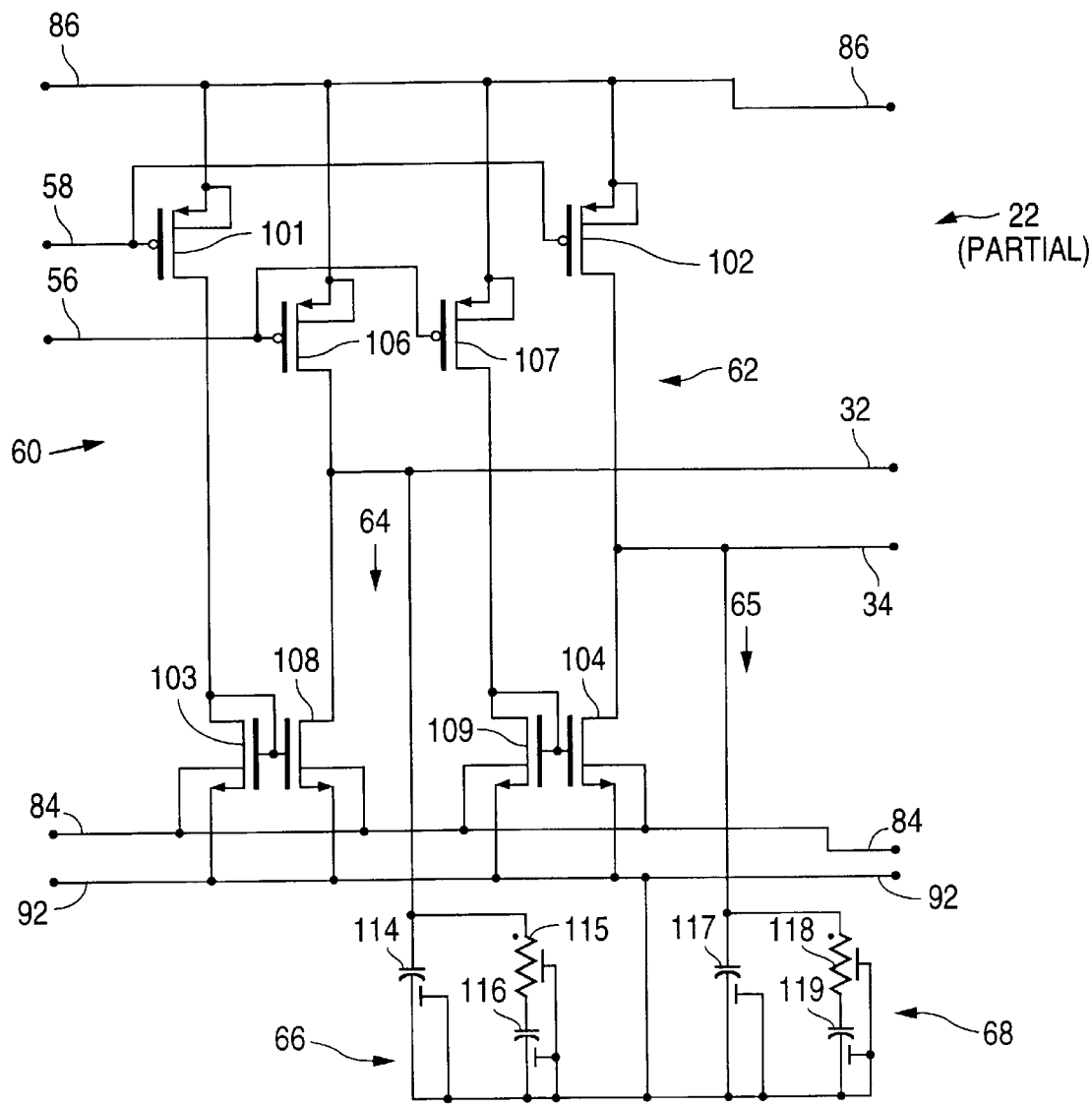
FIG. 7 is a circuit diagram of a charge pump circuit in the phase detector circuit.

Current mirror circuits 60 and 62 mirror currents generated based on first XOR signal 56 and second XOR signal 58, and generate currents 64 and 65. The interaction between the current mirror circuits 60 and 62 is shown in FIG. 7.

Loop filter circuits 66 and 68 are second-order loop filter circuits. Loop filter circuit 66 is charged by output current 64 and generates first phase signal 32. Loop filter circuit 68 is charged by output current 65 and generates second phase signal 34.

Figure 5:
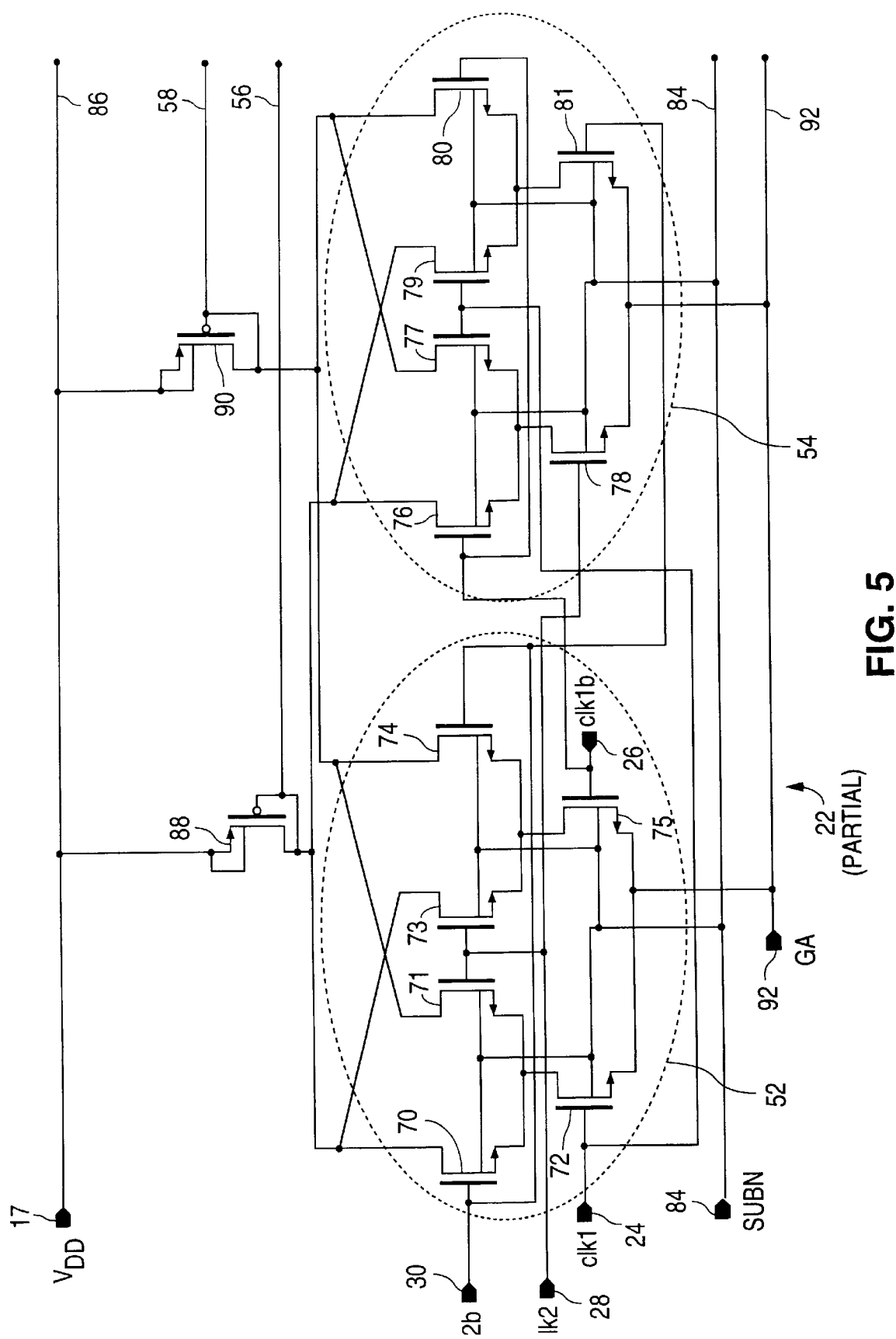
FIG. 5 is a circuit diagram of a first XOR circuit and a second XOR circuit in the phase detector circuit.

FIG. 5 shows further detail of phase detector circuit 22. Preferably, first XOR circuit 52 includes six NMOS transistors 70–75, and second XOR circuit 54 includes six NMOS transistors 76–81. The substrates of transistors 70–81 are connected to substrate node 84 which is connected to ground. The substrate may also be referred to as the body of the transistor.

The clock signals are each preferably connected to the gates of three transistors, as follows: first clock signal 24 is connected to the gates of transistors 72, 77, and 79; first complementary clock signal 26 is connected to the gates of transistors 75, 76, and 80; second clock signal 28 is connected to the gates of transistors 71, 73, and 78; and second complementary clock signal 30 is connected to the gates of transistors 70, 74, and 81.

Figure 1:
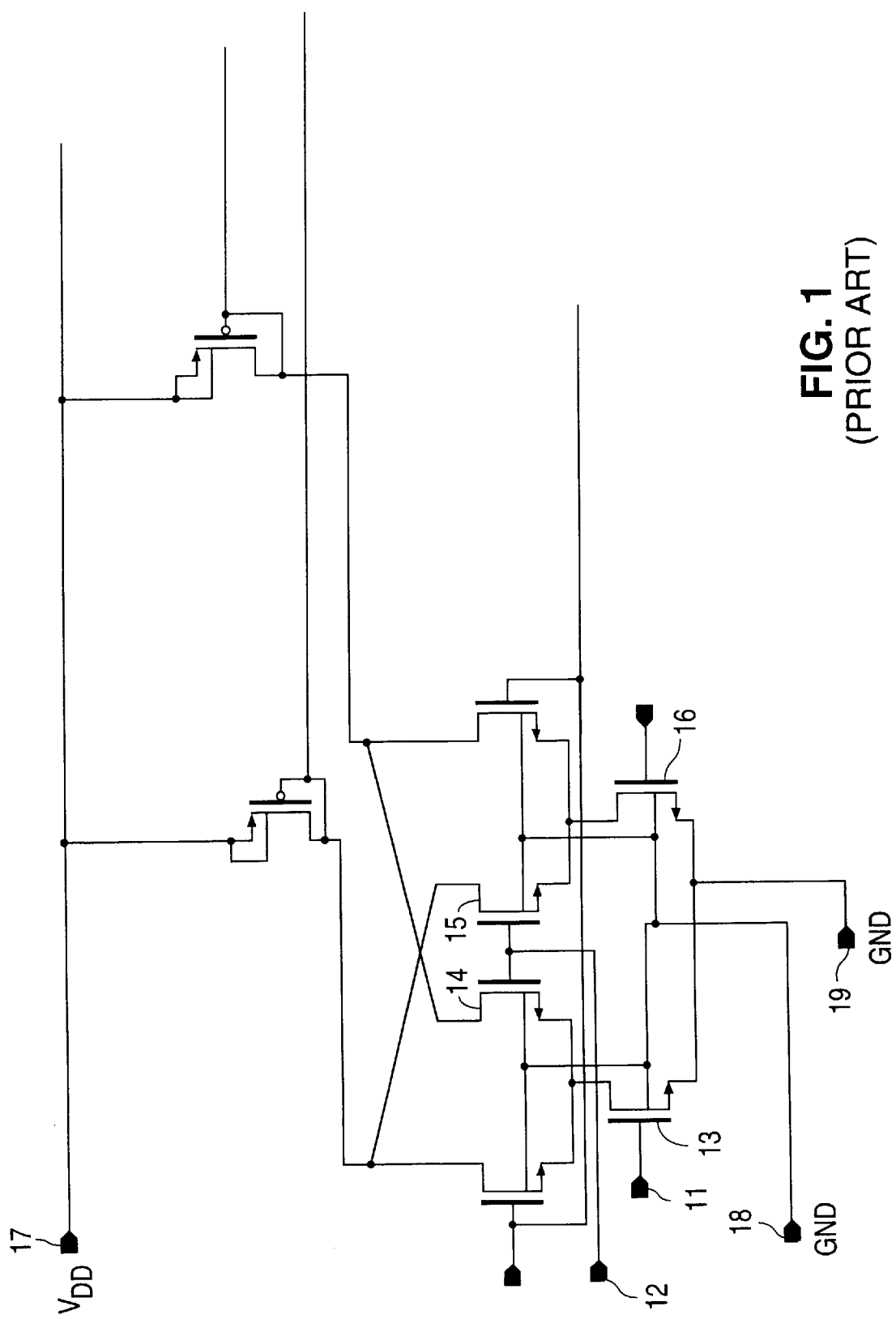
FIG. 1 is a circuit diagram of a prior art XOR phase detector circuit.

This connection of the two XOR circuits 52 and 54 to receive the same inputs is termed cross-coupling. Cross-coupling cancels the asymmetry of XOR signals 56 and 58. Specifically, as discussed above with reference to FIG. 1, first clock signal 24 gates transistor 72 without body effect, but second clock signal 28 gates transistors 71 and 73 with body effect. Similarly, second clock signal 28 gates transistor 78 without body effect, but first clock signal 24 gates transistors 77 and 79 with body effect. Cross-coupling cancels the static phase alignment error because any error due to the body effect of transistors 71 and 73 is offset by the error due to the body effect of transistors 77 and 79.

Power supply node 86 provides power to first XOR circuit 52 through diode-connected transistor 88, and to second XOR circuit 54 through diode-connected transistor 90. Transistors 88 and 90 are preferably PMOS transistors, thereby forming CMOS circuitry with XOR circuits 52 and 54. Ground node 92 connects to the sources of transistors 72, 75, 78, and 81.

Transistors 88 and 90 are coupled to XOR circuits 52 and 54 to generate first XOR signal 56 and second XOR signal 58. The XOR circuits 52 and 54 are cross-coupled to each generate a part of the XOR signals 56 and 58. Specifically, the transistors 70, 73, 76, and 79 generate the first XOR signal 56; and the transistors 71, 74, 77, and 80 generate the second XOR signal 58. In this instance half of each of the XOR circuits 52 and 54 generates one of the XOR signals 56 and 58, although other arrangements may be made.

Besides canceling the body effect, the circuit of FIG. 5 has other advantages, including that the XOR signals 56 and 58 may be much smaller than the full swing range of the power supply. This decreases the output noise of phase detector circuit 22 and allows high speed operation.

Figure 6:
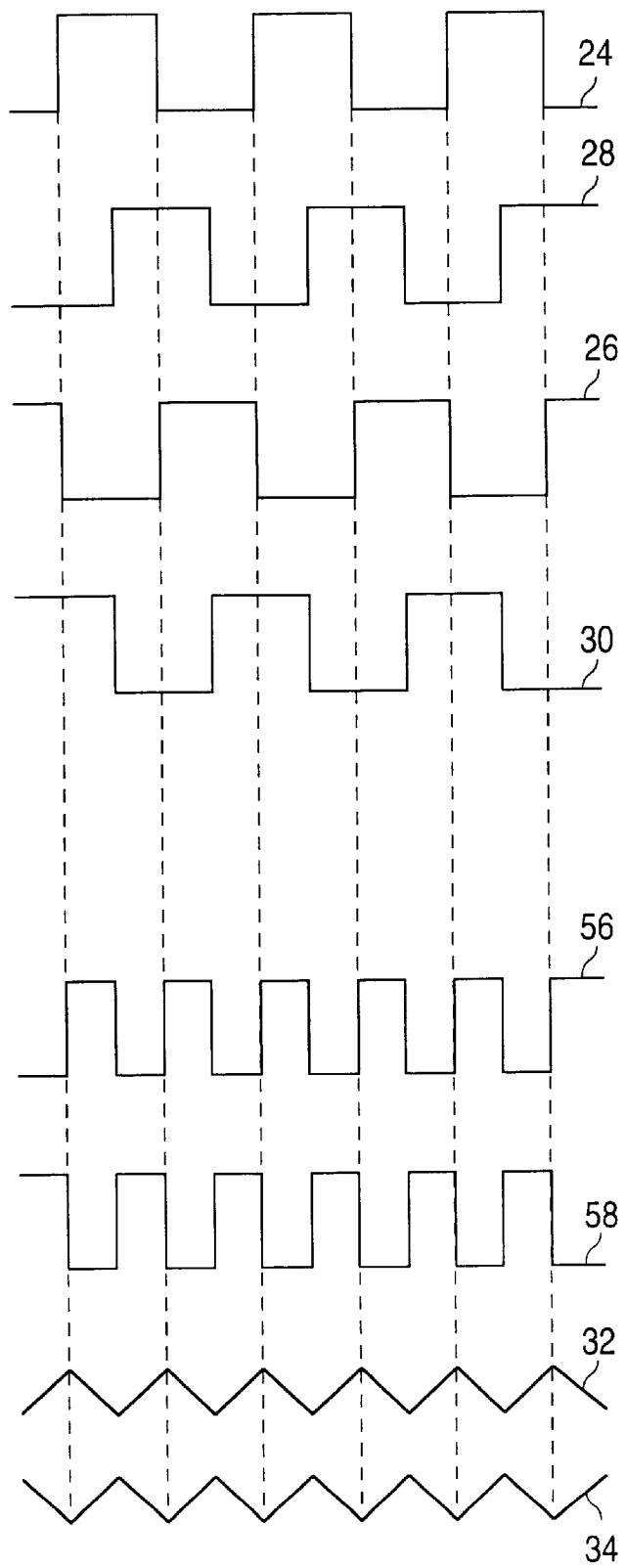
FIG. 6 is a waveform diagram of various signals in the phase detector circuit.

FIG. 6 illustrates the operation of the circuit shown in FIG. 5. First clock signal 24 preferably has a 50% duty cycle. First complementary clock signal 26 is complementary to first clock signal 24. Second clock signal 28 preferably has a 50% duty cycle. Second complementary clock signal 30 is complementary to second clock signal 28. First XOR signal 56 is the XOR of first clock signal 24 and second clock signal 28. Second XOR signal 58 is the complementary XOR of first clock signal 24 and second clock signal 28. When second clock signal 28 follows first clock signal 24 by a quarter period, as shown in FIG. 6, XOR signals 56 and 58 also have a 50% duty cycle.

FIG. 7 shows further detail of phase detector circuit 22. Preferably, current mirror circuit 62 includes two PMOS transistors 101–102 and two NMOS transistors 103–104, and current mirror circuit 60 includes two PMOS transistors 106–107 and two NMOS transistors 108–109. The substrates of transistors 101–102 and 106–107 are connected to their respective sources and to power supply node 86. The XOR signal 56 gates transistors 106–107 and XOR signal 58 gates transistors 101–102.

The substrates of transistors 103–104 and 108–109 are connected to substrate node 84 which is connected to ground. The sources of transistors 103–104 and 108–109 are connected to ground node 92.

Transistors 103 and 108 are part of one current mirror, and transistors 109 and 104 are part of another. The phase signal 32 is charged by the transistor 106 and discharged by the transistor 108. The current through transistor 101 equals the current through transistor 103. Therefore, the phase signal 32 is dependent upon both the XOR signals 56 and 58. Similarly, the phase signal 34 is dependent upon both the XOR signals 56 and 58.

As previously discussed (see FIG. 4 and accompanying text), the current mirror circuits 60 and 62 charge the loop filter circuits 66 and 68. Returning to FIG. 7, loop filter circuit 66 includes capacitive element 114 in parallel with serially-connected resistive element 115 and capacitive element 116. Loop filter circuit 68 includes capacitive element 117 in parallel with serially-connected resistive element 118 and capacitive element 119. The current mirror circuits 60 and 62 together with the loop filter circuits 66 and 68 may also be referred to as a differential charge pump circuit.

As can be seen from the circuit diagram of FIG. 7, XOR signal 56 controls transistor 106, causing output current 64 to charge loop filter circuit 66. The XOR signal 58 controls transistor 102, causing output current 65 to charge loop filter circuit 68. The XOR signals 56 and 58 control the other transistors 107, 109, and 104 (and 101, 103, and 108) to discharge the loop filter circuits 66 and 68. The charging and discharging generate phase signals 32 and 34. The phase signals 32 and 34 are analog voltage signals related to a phase difference between the clock signals 24 and 28.

The circuit of FIG. 7 has a number of advantages. First, the circuit has easy device matching for CMOS technology. For many existing charge pumps, the PMOS path is turned on for charging and the NMOS path is turned on for discharging. This increases the difficulty of matching PMOS and NMOS through all process corners. The circuit of FIG. 7 requires only PMOS-to-PMOS and NMOS-to-NMOS matching; for example, transistor 103 matches to 108, 109 matches to 104, 101 matches to 102, and 106 matches to 107. Thus, matching is made easier.

Second, the circuit can operate at a lower supply voltage. Many existing charge pumps have two NMOS and two PMOS transistors between the power supply node and ground. However, the circuit of FIG. 7 has only one NMOS and PMOS pair (e.g., transistors 101 and 103) between power supply node 86 and ground node 92.

Figure 8:
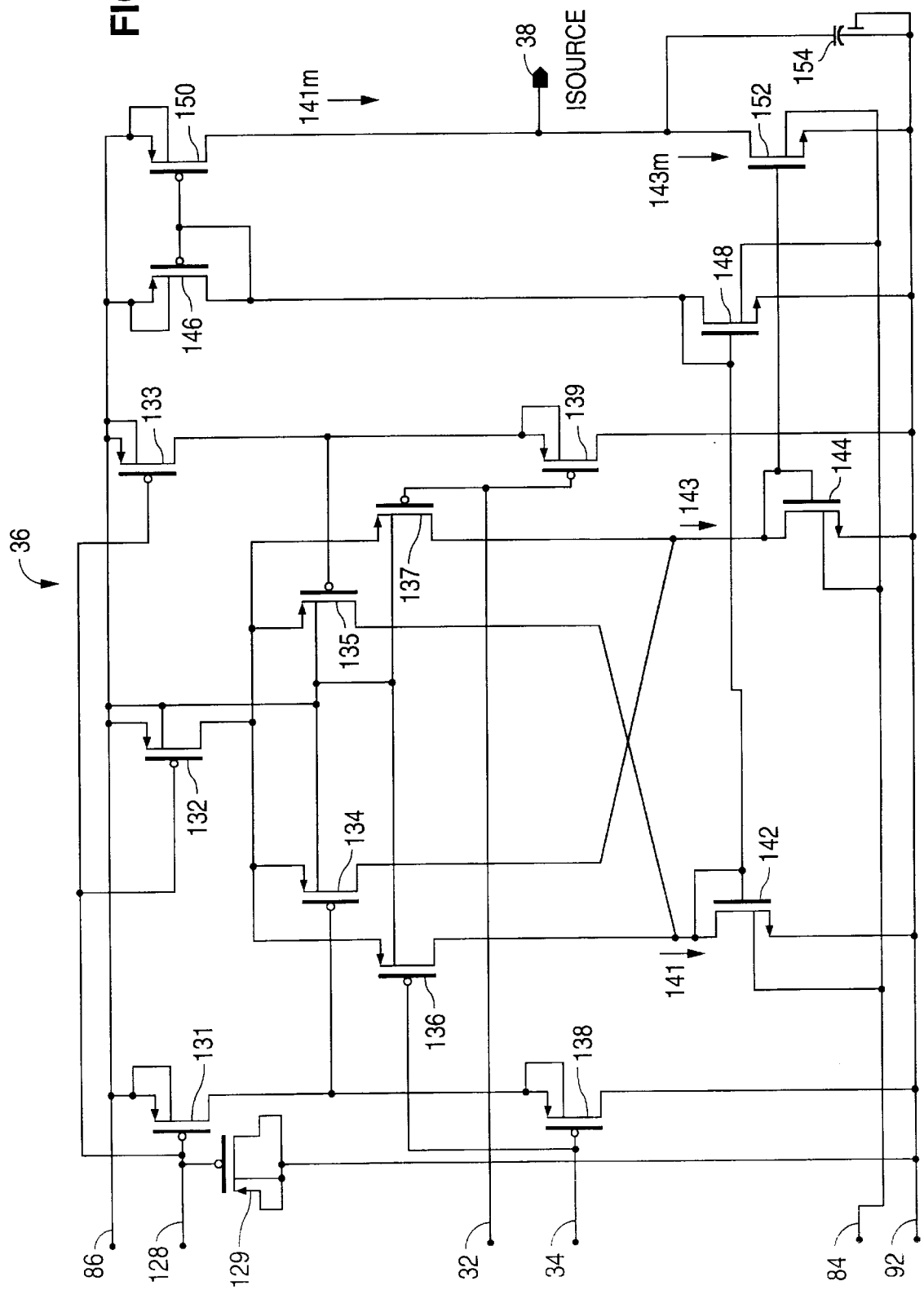
FIG. 8 is a circuit diagram of a transconductance circuit according to the present invention.

FIG. 8 illustrates the detail of transconductance circuit 36 (see FIG. 3). Transconductance circuit 36 includes nine PMOS transistors 131–139. The gates of transistors 129 and 131–133 are connected to bias node 128. The sources and substrates of transistors 131–133 are connected to power supply node 86. The substrates of transistors 134–137 are connected to power supply node 86. Transistor 129 functions as a capacitor.

The substrates of transistors 142, 144, 148, and 152 are connected to substrate node 84 which is connected to ground. The sources of transistors 142, 144, 148, and 152, and the drains of transistors 138–139, are connected to ground node 92.

The gates of transistors 136 and 138 receive second phase signal 34 and the gates of transistors 137 and 139 receive first phase signal 32. As can be seen from FIG. 8, the phase signals 32 and 34 control these transistors, which generate output currents 141 and 143. A difference between the output currents 141 and 143 is proportional to a difference between the phase signals 32 and 34.

The substrates of transistors 138–139 are connected to their respective sources, thereby canceling any body effects.

Transistors 146, 150, and 148 form a current mirror circuit with transistor 142 to mirror output current 141 (shown as current 141m). Transistor 152 forms a current mirror circuit with transistor 144 to mirror output current 143 (shown as current 143m). One of the mirrored currents 141m charges capacitive element 154, and the other 143m discharges capacitive element 154. The net current at output node 38 is then also proportional to a difference between the phase signals 32 and 34. The net current at output node 38 may then be used to adjust clock signals 24 and 28 (see FIG. 3).

The circuit of FIG. 8 differs from many existing transconductance circuits in two main ways. First, transconductance circuit 36 is implemented in part in PMOS, instead of only NMOS, using a single N-well CMOS process. For most of today's industrial world, the single N-well process is preferred; however, the single N-well process cannot support a source-to-substrate connection for an NMOS transistor. The use of PMOS devices allows a source-to-substrate connection, which eliminates body effects as discussed above.

Figure 2:
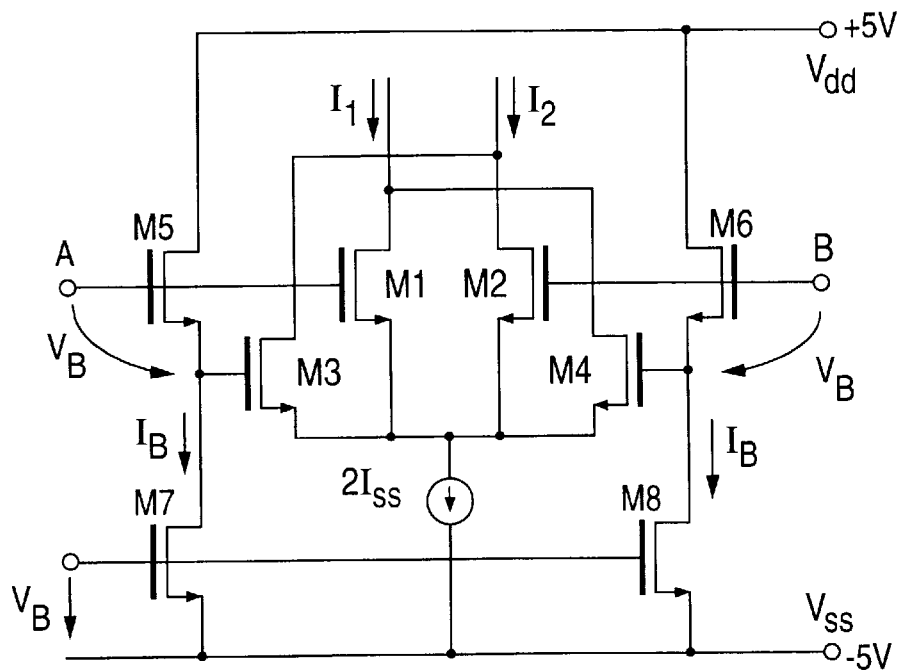
FIG. 2 is a circuit diagram of a prior art transconductance circuit.

Second, as mentioned above, the substrates of transistors 138–139 are connected to their sources instead of to the power supply node. In the prior art as shown in FIG. 2, as discussed above, it is generally assumed that the gate-source voltages of M5 and M7 are both $V_B$, and body effects are neglected. The body effects contribute to nonlinearity. However, in the present invention, body effects are avoided. This gives a more linear transconductance operation.

The transconductance circuit 36 has a number of advantages, especially when implemented as part of a delay-locked or phase-locked loop circuit. First, use of transconductance circuit 36 as the output stage of the differential charge pump circuit (see FIG. 7) improves the output ripple. Without the transconductance circuit, the feedback information for the delay-locked loop circuit would be generated directly from phase signals 32 and 34 (see FIG. 7). These signals have output ripple caused by their proximity to the switching transistor pairs 106 and 108, and 102 and 104. In transconductance circuit 36, the output node 38 is not directly connected to high speed switching PMOS or NMOS devices, so the output ripple is reduced.

Second, transconductance circuit 36 improves the common mode rejection ratio for the differential charge pump circuit (see FIG. 7). The common mode noise from the XOR circuits 52 and 54 (see FIG. 4) will influence both XOR signals 56 and 58 to the same extent. Use of the transconductance circuit 36 following the differential charge pump circuit improves the common mode rejection ratio because the output of transconductance 36 depends on the difference between the input voltages, so the common mode noise cancels out.

The theory of operation of transconductance circuit 36 follows. The variables representing voltages and currents correspond to FIG. 8 as follows. Voltage and current are signified by V and I. Gate, source, and drain are signified by the subscripts $_G$, $_S$, and $_D$. Each transistor and each node is signified by its reference numeral from FIG. 8. For example, the current from the drain of transistor 136 is signified $I_D136$.

To start the theory, $$I141=I_D136+I_D135$$

$$I143=I_D137+I_D134$$

When transistors 134–137 are operating in the saturation region, $$I_D136=K(V34-V_D132-V_{threshold}136)^2$$

$$I_D134=K(V_D131-V_D132-V_{threshold}134)^2$$

$$I_D135=K(V_D133-V_D132-V_{threshold}135)^2$$

$$I_D137=K(V32-V_D132-V_{threshold}137)^2$$

thus, $$I_{net}=I141-I143=(I_D136+I_D135)-(I_D134+I_D137)$$

$$I_{net}=(I_D136-I_D134)+(I_D135-I_D137)$$

Transistors 134–137 all have the same size, the same source connection, and the same substrate connection. Because the body effect is due to the voltage difference between the source and the substrate, transistors 134–137 have the same body effect and the same threshold voltage. Thus, $$V_{threshold}=V_{threshold}134=V_{threshold}135=V_{threshold}136=V_{threshold}137$$

Assume that $$V_{net}=V_{threshold}+V_D132$$

Thus, $$I_D136=K(V34-V_{net})^2$$

$$I_D134=K(V_D131-V_{net})^2$$

$$I_D135=K(V_D133-V_{net})^2$$

$$I_D137=K(V32-V_{net})^2$$

thus, $$I_D136-I_D134=K(V34-V_D131)(V34+V_D131-2*V_{net})$$

$$I_D135-I_D137=K(V_D133-V32)(V_D133+V32-2*V_{net})$$

Transistors 138 and 139 have their sources connected to their substrates, so they have no body effect. Thus, $$V_{threshold}138=V_{threshold}139$$

Transistors 131 and 133 are current sources, and $$I_D131=I_D133$$

Transistors 138 and 139 are source followers, so $$I_D138=I_D139=I_{sourcefollower}$$

Thus, $$V34-V_D131=V32-V_D133=V_{transconductance}$$

Thus, $$I_{net}=K*V_{transconductance}(V34+V_D131-2*V_{net}-V_D133-V32+2*V_{net})$$

$$I_{net}=K*V_{transconductance}(V34-V32+V_D131-V_D133)$$

Thus, $$I_{net}=2*K*V_{transconductance}(V34-V32)$$

Defining the gain G of the transconductance circuit as $$G=2*K*V_{transconductance}$$

then $$I_{net}=G*(V34-V32)$$

that is, the gain G of the transconductance circuit times the voltage difference between the phase signals 32 and 34.

Thus, $$I_{sourcefollower} = K(V_{transconductance} - V_{threshold})^2$$

$$\sqrt{\frac{I_{sourcefollower}}{K}} + V_{threshold} = V_{transcondutor}$$

$$G = 2 \cdot K \cdot \left( \sqrt{\frac{I_{sourcefollower}}{K}} + V_{threshold} \right)$$

It should be understood that various alternatives to the embodiments of the invention described herein may be employed in practicing the invention. It is intended that the following claims define the scope of the invention and that structures within the scope of these claims and their equivalents are covered thereby.

What is claimed is:

1. An apparatus including a circuit for reducing transistor body effect when generating a transconductance signal proportional to a difference between two input clock signals including a first signal and a second signal, said circuit comprising:

a phase detector circuit including a plurality of circuit elements, said phase detector circuit configured to receive said first signal, a first complementary signal being complementary to said first signal, said second signal, and a second complementary signal being complementary to said second signal, and in accordance therewith to generate a first phase signal based on a first XOR signal being an XOR of said first signal and said second signal, and to generate a second phase signal based on a second XOR signal being a complementary XOR of said first signal and said second signal, wherein said first signal, said first complementary signal, said second signal, and said second complementary signal are each received by a corresponding one of a plurality of equal portions of said plurality of circuit elements; and a transconductance circuit, coupled to said phase detector circuit, configured to receive said first phase signal and said second phase signal and in accordance therewith to generate said transconductance signal proportional to a difference between said first phase signal and said second phase signal, said transconductance circuit including two PMOS transistors each having a substrate and a source wherein said source is coupled to said substrate, wherein said plurality of circuit elements comprises a plurality of NMOS and PMOS transistors; and wherein each of said equal portions includes exactly three circuit elements.

2. The apparatus of claim 1, wherein said phase detector circuit comprises:

a first XOR circuit configured to receive said first signal, said first complementary signal, said second signal, and said second complementary signal, and in accordance therewith to generate said first XOR signal; and a second XOR circuit, coupled to said first XOR circuit, configured to receive said first signal, said first complementary signal, said second signal, and said second complementary signal, and in accordance therewith to generate said second XOR signal, wherein said plurality of circuit elements includes said first XOR circuit and said second XOR circuit.

3. The apparatus of claim 2, wherein:

a first one of said plurality of circuit elements in said first XOR circuit and a first two of said plurality of circuit elements in said second XOR circuit are configured to receive said first signal;

a second one of said plurality of circuit elements in said first XOR circuit and a second two of said plurality of circuit elements in said second XOR circuit are configured to receive said first complementary signal;

a third two of said plurality of circuit elements in said first XOR circuit and a third one of said plurality of circuit elements in said second XOR circuit are configured to receive said second signal; and a fourth two of said plurality of circuit elements in said first XOR circuit and a fourth one of said plurality of circuit elements in said second XOR circuit are configured to receive said second complementary signal.

4. The apparatus of claim 2, wherein said phase detector circuit further comprises:

a charge pump circuit, coupled to said first XOR circuit and said second XOR circuit, configured to receive said first XOR signal and said second XOR signal and in accordance therewith to generate said first phase signal and said second phase signal, wherein said plurality of circuit elements does not include said charge pump circuit.

5. The apparatus of claim 4, wherein said charge pump circuit comprises:

a first current mirror circuit configured to receive said first XOR signal and in accordance therewith to generate a first mirrored XOR signal;

a first loop filter circuit, coupled to said first current mirror circuit, configured to receive said first mirrored XOR signal and in accordance therewith to generate said first phase signal;

a second current mirror circuit configured to receive said second XOR signal and in accordance therewith to generate a second mirrored XOR signal; and a second loop filter circuit, coupled to said second current mirror circuit, configured to receive said second mirrored XOR signal and in accordance therewith to generate said second phase signal.

6. An apparatus including a circuit for reducing transistor body effect when generating a transconductance signal proportional to a difference between two input clock signals including a first signal and a second signal, said circuit comprising:

a phase detector circuit including a plurality of circuit elements, said phase detector circuit configured to receive said first signal, a first complementary signal being complementary to said first signal, said second signal, and a second complementary signal being complementary to said second signal, and in accordance therewith to generate a first phase signal based on a first XOR signal being an XOR of said first signal and said second signal, and to generate a second phase signal based on a second XOR signal being a complementary XOR of said first signal and said second signal, wherein said first signal, said first complementary signal, said second signal, and said second complementary signal are each received by a corresponding one of a plurality of equal portions of said plurality of circuit elements; and a transconductance circuit, coupled to said phase detector circuit, configured to receive said first phase signal and said second phase signal and in accordance therewith to generate said transconductance signal proportional to a difference between said first phase signal and said second phase signal, said transconductance circuit including two PMOS transistors each having a substrate and a source wherein said source is coupled to said substrate, wherein said transconductance circuit comprises:

a first PMOS transistor, a second PMOS transistor, and a third PMOS transistor, each having a source coupled to a first node, a gate coupled to a second node, a substrate coupled to said first node, and a drain;

a fourth PMOS transistor having a source coupled to said second PMOS transistor drain, a gate coupled to said first PMOS transistor drain, a substrate coupled to said first node, and a drain coupled to a third node;

a fifth PMOS transistor having a source coupled to said second PMOS transistor drain, a gate coupled to said third PMOS transistor drain, a substrate coupled to said first node, and a drain coupled to a fourth node;

a sixth PMOS transistor having a source coupled to said second PMOS transistor drain, a gate configured to receive said second phase signal, a substrate coupled to said first node, and a drain coupled to said fourth node;

a seventh PMOS transistor having a source coupled to said second PMOS transistor drain, a gate configured to receive said first phase signal, a substrate coupled to said first node, and a drain coupled to said third node;

an eighth PMOS transistor having a source coupled to said first PMOS transistor drain, a gate configured to receive said second phase signal, and a substrate coupled to said first PMOS transistor drain; and a ninth PMOS transistor having a source coupled to said third PMOS transistor drain, a gate configured to receive said first phase signal, and a substrate coupled to said third PMOS transistor drain, wherein said fourth PMOS transistor drain and said seventh PMOS transistor drain are configured to generate a first output signal, wherein said fifth PMOS transistor drain and said sixth PMOS transistor drain are configured to generate a second output signal, wherein said eighth PMOS transistor and said ninth PMOS transistor are said two PMOS transistors, and wherein said transconductance signal is based on said first output signal and said second output signal.

7. The apparatus of claim 6, wherein said transconductance circuit further comprises:
a first output current mirror circuit, coupled to said fourth node, configured to receive said second output signal and in accordance therewith to charge an output capacitance; and
a second output current mirror circuit, coupled to said third node, configured to receive said first output signal and in accordance therewith to discharge said output capacitance,
wherein said transconductance signal is equal to a difference between said first output signal and said second output signal.

8. An apparatus including a circuit for reducing transistor body effect when generating a transconductance signal proportional to a difference between two input clock signals including a first signal and a second signal, said circuit comprising:
a phase detector circuit including a plurality of circuit elements, said phase detector circuit configured to receive said first signal, a first complementary signal being complementary to said first signal, said second signal, and a second complementary signal being complementary to said second signal, and in accordance therewith to generate a first phase signal based on a first XOR signal being an XOR of said first signal and said second signal, and to generate a second phase signal based on a second XOR signal being a complementary XOR of said first signal and said second signal, wherein said first signal, said first complementary signal, said second signal, and said second complementary signal are each received by a corresponding one of a plurality of equal portions of said plurality of circuit elements;
a transconductance circuit, coupled to said phase detector circuit, configured to receive said first phase signal and said second phase signal and in accordance therewith to generate said transconductance signal proportional to a difference between said first phase signal and said second phase signal, said transconductance circuit including two PMOS transistors each having a substrate and a source wherein said source is coupled to said substrate; and
a control circuit, coupled to said transconductance circuit, configured to receive said transconductance signal, a first unadjusted signal, and a second unadjusted signal, and in accordance therewith to adjust a relative phase between said first unadjusted signal and said second unadjusted signal, and in accordance therewith to generate said first signal and said second signal.

9. An apparatus including a circuit for reducing transistor body effect when generating a transconductance signal proportional to a difference between two input clock signals including a first signal and a second signal, said circuit comprising:
a transconductance circuit configured to receive said first signal and said second signal and in accordance therewith to generate said transconductance signal proportional to a difference between said first signal and said second signal, said transconductance circuit including two PMOS transistors each having a substrate and a source wherein said source is coupled to said substrate, wherein said transconductance circuit comprises:
a first PMOS transistor, a second PMOS transistor, and a third PMOS transistor, each having a source coupled to a first node, a gate coupled to a second node, a substrate coupled to said first node, and a drain;
a fourth PMOS transistor having a source coupled to said second PMOS transistor drain, a gate coupled to said first PMOS transistor drain, a substrate coupled to said first node, and a drain coupled to a third node;
a fifth PMOS transistor having a source coupled to said second PMOS transistor drain, a gate coupled to said third PMOS transistor drain, a substrate coupled to said first node, and a drain coupled to a fourth node;
a sixth PMOS transistor having a source coupled to said second PMOS transistor drain, a gate configured to receive said second signal, a substrate coupled to said first node, and a drain coupled to said fourth node;
a seventh PMOS transistor having a source coupled to said second PMOS transistor drain, a gate configured to receive said first signal, a substrate coupled to said first node, and a drain coupled to said third node;
an eighth PMOS transistor having a source coupled to said first PMOS transistor drain, a gate configured to receive said second signal, and a substrate coupled to said first PMOS transistor drain; and
a ninth PMOS transistor having a source coupled to said third PMOS transistor drain, a gate configured to receive said first signal, and a substrate coupled to said third PMOS transistor drain,
wherein said fourth PMOS transistor drain and said seventh PMOS transistor drain are configured to generate a first output signal, wherein said fifth PMOS transistor drain and said sixth PMOS transistor drain are configured to generate a second output signal, wherein said eighth PMOS transistor and said ninth PMOS transistor are said two PMOS transistors, and wherein said transconductance signal results from a difference between said first output signal and said second output signal.

10. An apparatus including a circuit for reducing transistor body effect when generating phase signals resulting from input signals, said circuit comprising:
a phase detector circuit including a plurality of circuit elements, said phase detector circuit configured to receive a first signal, a first complementary signal being complementary to said first signal, a second signal, and a second complementary signal being complementary to said second signal, and in accordance therewith to generate a first phase signal based on a first XOR signal being an XOR of said first signal and said second signal, and to generate a second phase signal based on a second XOR signal being a complementary XOR of said first signal and said second signal, wherein said first signal, said first complementary signal, said second signal, and said second complementary signal are each received by a corresponding one of a plurality of equal portions of said plurality of circuit elements,
wherein said phase signals include said first phase signal and said second phase signal;
wherein said input signals include said first signal, said first complementary signal, said second signal, and said second complementary signal;
wherein said plurality of circuit elements comprises a plurality of NMOS and PMOS transistors; and
wherein each of said equal portions includes exactly three circuit elements.

11. The apparatus of claim 10, wherein said phase detector circuit comprises:
   a first XOR circuit configured to receive said first signal, said first complementary signal, said second signal, and said second complementary signal, and in accordance therewith to generate said first XOR signal; and
   a second XOR circuit, coupled to said first XOR circuit, configured to receive said first signal, said first complementary signal, said second signal, and said second complementary signal, and in accordance therewith to generate said second XOR signal,
   wherein said plurality of circuit elements includes said first XOR circuit and said second XOR circuit.

12. The apparatus of claim 11, wherein:
   a first one of said plurality of circuit elements in said first XOR circuit and a first two of said plurality of circuit elements in said second XOR circuit are configured to receive said first signal;
   a second one of said plurality of circuit elements in said first XOR circuit and a second two of said plurality of circuit elements in said second XOR circuit are configured to receive said first complementary signal;
   a third two of said plurality of circuit elements in said first XOR circuit and a third one of said plurality of circuit elements in said second XOR circuit are configured to receive said second signal; and
   a fourth two of said plurality of circuit elements in said first XOR circuit and a fourth one of said plurality of circuit elements in said second XOR circuit are configured to receive said second complementary signal.

13. A method of reducing transistor body effect when generating a transconductance signal proportional to a difference between two input clock signals including a first signal and a second signal, comprising the steps of:
   receiving said first signal, a first complementary signal being complementary to said first signal, said second signal, and a second complementary signal being complementary to said second signal;
   providing each of said first signal, said first complementary signal, said second signal, and said second complementary signal to a corresponding one of a plurality of equal portions of a plurality of circuit elements;
   generating a first phase signal based on a first XOR signal being an XOR of said first signal and said second signal;
   generating a second phase signal based on a second XOR signal being a complementary XOR of said first signal and said second signal;
   receiving said first phase signal and said second phase signal by two PMOS transistors each having a source and a substrate wherein said source is coupled to said substrate;
   generating said transconductance signal proportional to a difference between said first phase signal and said second phase signal;
   receiving said transconductance signal, a first preadjusted signal and a second preadjusted signal;
   adjusting a relative phase between said first preadjusted signal and said second preadjusted signal; and
   generating said first signal and said second signal.

14. An apparatus including a circuit for reducing transistor body effect when generating a transconductance signal proportional to a difference between two input clock signals including a first signal and a second signal, said circuit comprising:
   a phase detector circuit including a plurality of circuit elements, said phase detector circuit configured to receive said first signal, a first complementary signal being complementary to said first signal, said second signal, and a second complementary signal being complementary to said second signal, and in accordance therewith to generate a first phase signal based on a first XOR signal being an XOR of said first signal and said second signal, and to generate a second phase signal based on a second XOR signal being a complementary XOR of said first signal and said second signal, wherein said first signal, said first complementary signal, said second signal, and said second complementary signal are each received by a corresponding one of a plurality of equal portions of said plurality of circuit elements; and
   a transconductance circuit, coupled to said phase detector circuit, configured to receive said first phase signal and said second phase signal and in accordance therewith to generate said transconductance signal proportional to a difference between said first phase signal and said second phase signal, said transconductance circuit including two PMOS transistors each having a substrate and a source wherein said source is coupled to said substrate,
   wherein said phase detector circuit comprises:
      a first XOR circuit configured to receive said first signal, said first complementary signal, said second signal, and said second complementary signal, and in accordance therewith to generate said first XOR signal; and
      a second XOR circuit, coupled to said first XOR circuit, configured to receive said first signal, said first complementary signal, said second signal, and said second complementary signal, and in accordance therewith to generate said second XOR signal,
      wherein said plurality of circuit elements includes said first XOR circuit and said second XOR circuit;
   wherein said phase detector circuit further comprises:
      a charge pump circuit, coupled to said first XOR circuit and said second XOR circuit, configured to receive said first XOR signal and said second XOR signal and in accordance therewith to generate said first phase signal and said second phase signal,
      wherein said plurality of circuit elements does not include said charge pump circuit;
   wherein said charge pump circuit comprises:
      a first current mirror circuit configured to receive said first XOR signal and in accordance therewith to generate a first mirrored XOR signal;
      a first loop filter circuit, coupled to said first current mirror circuit, configured to receive said first mirrored XOR signal and in accordance therewith to generate said first phase signal;
      a second current mirror circuit configured to receive said second XOR signal and in accordance therewith to generate a second mirrored XOR signal; and
      a second loop filter circuit, coupled to said second current mirror circuit, configured to receive said second mirrored XOR signal and in accordance therewith to generate said second phase signal.

* * * * *